United States Patent [19]
Liu et al.

[11] Patent Number: 5,964,880
[45] Date of Patent: Oct. 12, 1999

[54] CIRCUIT INTERFACE SYNCHRONIZATION USING SLAVE VARIABLE DELAY LOOP

[75] Inventors: Jonathan H. Liu, Folsom; Michael J. Allen, Rescue, both of Calif.

[73] Assignee: Intel Corporation, Santa Clara, Calif.

[21] Appl. No.: 08/987,797

[22] Filed: Dec. 10, 1997

[51] Int. Cl.⁶ .......................................... G06F 1/12
[52] U.S. Cl. .......................................... 713/401
[58] Field of Search .................. 395/551, 552; 327/158; 713/400, 401

[56] References Cited

U.S. PATENT DOCUMENTS

| | | | |
|---|---|---|---|
| 5,101,117 | 3/1992 | Johnson et al. | |
| 5,552,726 | 9/1996 | Wichman et al. | 327/158 X |
| 5,570,054 | 10/1996 | Takla | 327/158 X |
| 5,644,604 | 7/1997 | Larson | 375/354 |
| 5,815,016 | 9/1998 | Erickson | 327/158 |

*Primary Examiner*—Thomas M. Heckler
*Attorney, Agent, or Firm*—Blakely, Sokoloff, Taylor & Zafman LLP

[57] ABSTRACT

A method and apparatus is provided for synchronizing clock signals. The method includes receiving a first reference clock signal, generating a second clock signal, modifying the second clock signal to synchronize a first feedback input clock signal with the first reference clock signal, and modifying the second clock signal to synchronize a second feedback input clock signal with a second reference clock signal. The apparatus includes a phase aligning device having a first reference clock input adapted to receive a first reference clock signal, a first feedback input, and an output. A fixed delay device is coupled between the output of the phase aligning device and the first feedback input of the phase aligning device. A slave loop is coupled to the output of the phase aligning device.

27 Claims, 3 Drawing Sheets

CIRCUIT INTERFACE SYNCHRONIZATION USING SLAVE VARIABLE DELAY LOOP

BACKGROUND OF THE INVENTION

1. Field of the Invention

This invention relates generally to computer system clocks, and, more particularly, to synchronizing clock signals using a slave variable delay loop.

2. Description of the Related Art

Modem high performance computer systems comprise a plurality of electrical devices such as processors and memory controllers that are typically controlled by derivatives of a common reference clock signal. The reference clock signals must be synchronized at locations within the system, if the system is to function optimally. However, even though the individual reference clock signals may have a common source, they often do not arrive at their intended destination in proper synchronism due to flight time mismatches. For example, the electrical devices receiving the clock signal may be located at various distances from the common reference clock, causing the reference clock signals to reach the electrical devices at different times.

Synchronization involves aligning the clock edges (i.e. "de-skewing" or matching phases) of an on-chip receiver clock signal with a reference clock signal. Conventionally, a phase-lock loop (PLL) or a delay-lock loop (DLL) are utilized to align the edges of a receiver (or a driver) clock signal with a reference clock signal. Both PLLs and DLLs are well known in the art and, thus, their structure and operation will be apparent to persons skilled in the relevant art.

FIG. 1 illustrates a prior art method that utilizes PLLs 5,10 to align a first and second feedback input clock signals (also known as the channel 1 and 2 clock signals, respectively) 12,14 with the respective reference clock signals 15,20. As shown, a common source clock 25 generates the reference clock signals 26,28 that are coupled to the respective left and the right memory channels 30,35, which, for example, may be channels of a bank of dynamic random access memory (DRAM) chips. The left memory channel 30 is coupled to a first input/output (I/O) channel 40 of a device (i.e. a memory controller, for instance) 45, while the right memory channel 35 is coupled to a second I/O channel 50 of the device 45.

Because of the flight time mismatches, it is possible for the reference clock signal 26 and the reference clock signal 28 to be out of phase with respect of each other when they arrive at the device 45. For clarity, a left reference clock signal 15 is denoted to represent the reference clock signal 26 after it propagates through the left memory channel 30 and arrives at the first channel 40 of the device 45. Likewise, a right reference clock signal 20 represents the reference clock signal 28 at the second channel 50 of the device 45. The left and right reference clock signals 15,20 are input into the first I/O channel 40 and second I/O channel 50, respectively, and are further coupled to the input terminals of the respective PLLs 5,10.

The PLLs 5,10 typically include a phase detector (not shown) and a voltage controlled oscillator (VCO) (not shown) that generates a receiver clock signal 52,54. The phase detector of the PLLs 5,10 compares the phase of the channel 1 and channel 2 clock signals 12,14 with the phase of the respective reference clock signals 15,20. The output of the phase detector is then used to control the VCO, which generates a clock signal 52,54 so that the channel 1 and channel 2 clock signals 12,14 are substantially aligned with the respective reference clock signals 15,20. Once this phase alignment has occurred, the phase relationship between the reference clock signals 15,20 and the respective channel 1 and channel 2 clock signals 12,14 is referred to as being "locked." It is possible to have a plurality of clock buffers 60, 65 in a feedback loop of the PLLs 5,10.

Those skilled in the art will appreciate that DLLs (not shown) can be utilized in lieu of the PLLs 5,10 in FIG. 1. A DLL differs from a PLL 5,10 in that a voltage controlled delay (VCD) (not shown) is used instead of a voltage controlled oscillator (VCO) (not shown). Like the PLL 5,10, the DLL is capable of receiving two input signals and then "locking" the phases of the two signals.

While both PLL 5,10 and DLL (not shown) are capable of synchronizing the phases of the channel 1 and channel 2 clock signals 12,14 with the respective phases of the reference clock signals 15,20, they still suffer from several shortcomings. A PLL 5,10 and DLL not only require substantial amounts of power for operation but also require a large estate (i.e. die size) on the device 45. The limited amount of power and space available on a device 45 becomes especially critical in situations where the device 45 has multiple input/output channels 40,50, where each I/O channel 40,50 requires a PLL 5,10 or DLL to synchronize the incoming reference clock signal 15,20 with a receiver clock signal. Thus, what is needed is a method and apparatus for synchronizing clock signals that demand less power and can be housed on a smaller die.

The present invention is directed to overcoming, or at least reducing the effects of, one or more of the problems set forth above.

SUMMARY OF THE INVENTION

In one aspect of the present invention, a method is provided for synchronizing clock signals. The method includes receiving a first reference clock signal, generating a second clock signal, modifying the second clock signal to synchronize a first feedback input clock signal with the first reference clock signal, and modifying the second clock signal to synchronize a second feedback input clock signal with a second reference clock signal.

In another aspect of the present invention, an apparatus is provided for synchronizing clock signals. The apparatus includes a phase aligning device having a first reference clock input adapted to receive a first reference clock signal, a first feedback input, and an output. A fixed delay device is coupled between the output of the phase aligning device and the first feedback input of the phase aligning device. A slave loop is coupled to the output of the phase aligning device.

BRIEF DESCRIPTION OF THE DRAWINGS

Other objects and advantages of the invention will become apparent upon reading the following detailed description and upon reference to the drawings in which.

Figure 1:
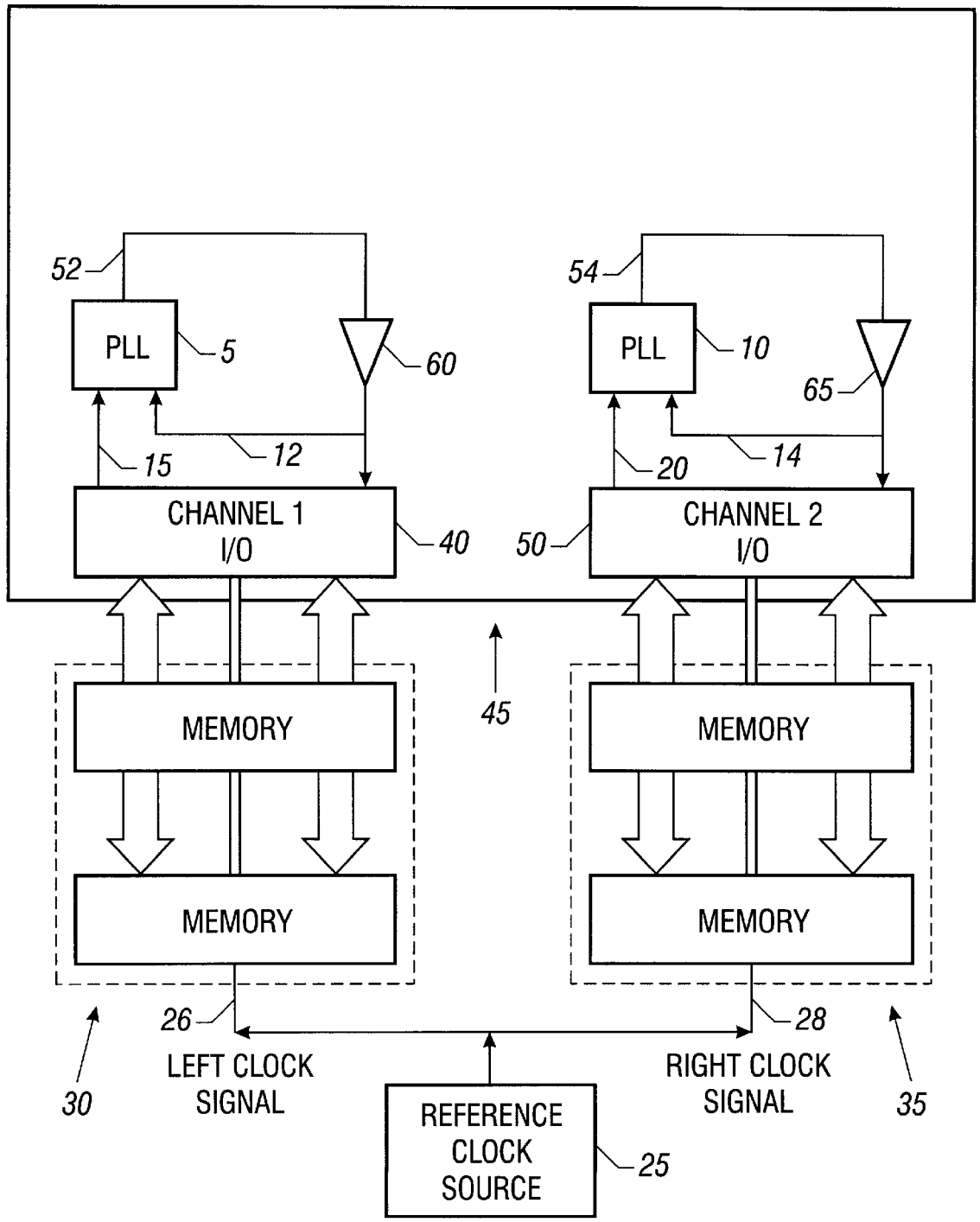
FIG. 1 is a block diagram of an exemplary prior art system employing PLLs.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will, of course, be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

First Embodiment

Figure 2:
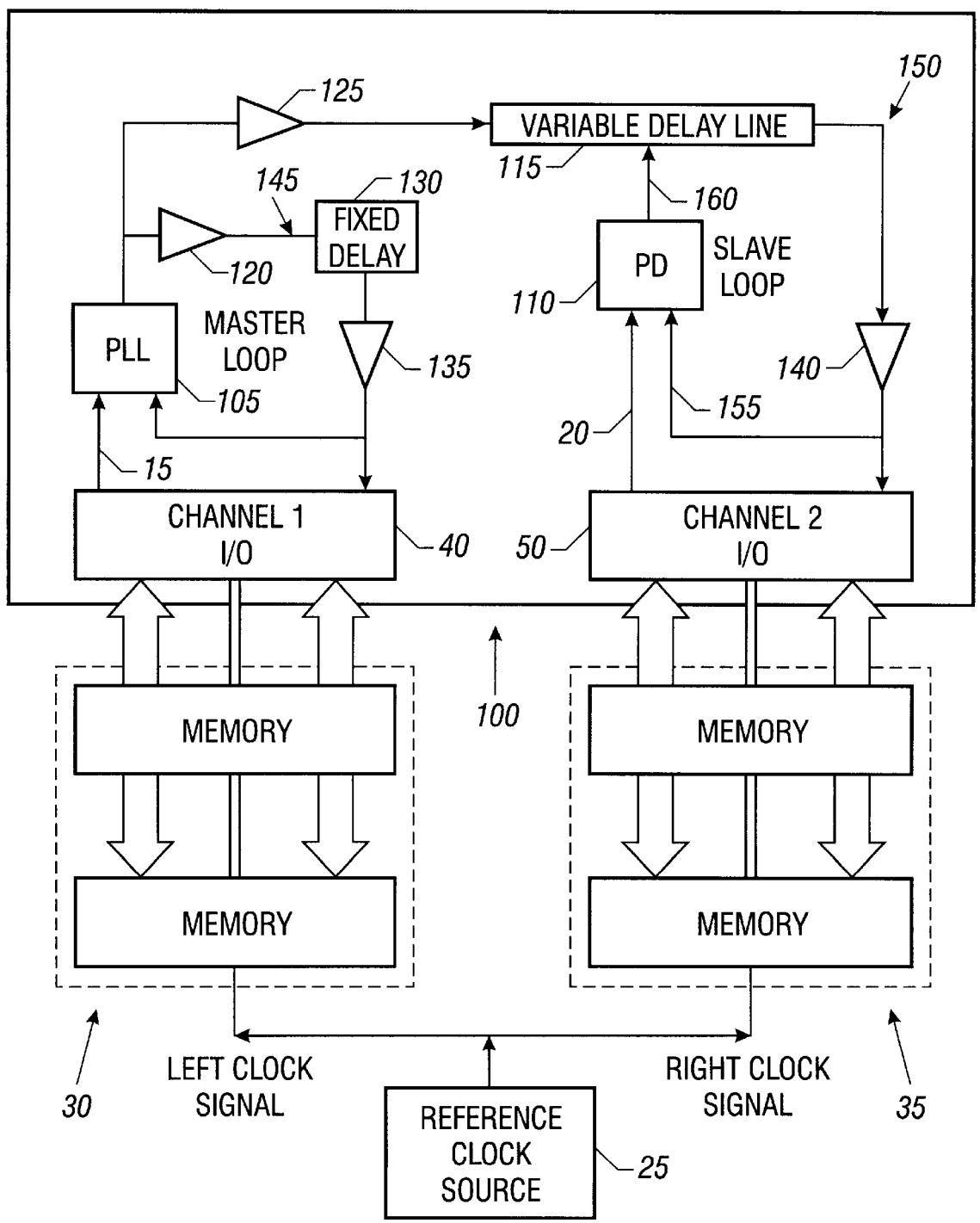
FIG. 2 is a block diagram of one embodiment of the present invention.

Referring now to the drawings, and in particular to FIG. 2, there is shown a first embodiment of the present invention. FIG. 2 illustrates a device 100, which can be a memory controller, for example, having a first and second I/O channel 40,50, where each I/O channel 40,50 is coupled to the respective left and right channel 30,35 and is adapted to receive a left and right reference clock signal 15,20 from a reference clock 25. Although the I/O channels 40,50 are coupled to channels 30,35 of a memory bank in this embodiment, it is also possible for the I/O channels 40,50 to serve as an interface to other external devices (not shown) as well, depending on the configuration in which the present invention is implemented. The device 100 further includes a PLL 105 and a phase detector 110, which has an output coupled to a variable delay line 115. As shown, the first I/O channel 40 receives the left reference clock signal 15, while the second I/O channel 50 receives the right reference clock signal 20.

A PLL-loop 145, herein referred to as a "Master Loop," and a variable delay line-loop 150, herein referred to as a "Slave Loop," synchronize the clock signals for the first and second I/O channels 40,50, respectively. The PLL-loop 145 is referred as the master loop because its output affects the slave loop 150. That is, a phase shift initiated by the PLL 105 in the master loop 145 propagates to the slave loop 150. The left reference clock signal 15 is termed as the Master Reference Clock ("MRC") because it is the only reference clock signal that is input into the PLL 105. Accordingly, the right reference clock signal 20 is termed as the Slave Reference Clock ("SRC").

The MRC 15 is input into a first input terminal of the PLL 105, while a second input terminal of the PLL 105 is coupled to the output signal of the PLL 105 through a feedback loop. The output signal of the PLL 105 is coupled to the input terminals of a first and second clock buffer 120,125. The output from the first clock buffer 120 is delayed for a fixed time interval by a fixed delay line 130. The delayed signal from the fixed delay line 130 is then coupled to an input terminal of a third clock buffer 135. The output from the third clock buffer 135 is coupled to the first I/O channel 40 as well as to a second input terminal of the PLL 105.

The output from the second clock buffer 125 is coupled to a first input of the variable delay line 115. The output of the variable delay line 115 is coupled to an input of a fourth clock buffer 140. The output of the fourth clock buffer 140 is coupled to the second I/O channel 50 as well as to a first input of a phase detector 110. The SRC 20 is coupled to a second input of the phase detector 110. The output of the phase detector 110 is coupled to a second input of a variable delay line 115.

The present invention utilizes the variable delay line 115 instead of a PLL to correct the skew between the slave loop clock signal 155 and the SRC 20. The variable delay line 115 should be capable of compensating for the worst skew "t_max_skew" between the MRC 15 and SRC 20. A variety of available variable delay lines 150 can be utilized to delay a clock signal by a desired time interval. One particular variable delay line that can be utilized with the present invention is the voltage-controlled delay line disclosed in U.S. Pat. No. 5,101,117, which issued Mar. 31, 1992 to Mark G. Johnson, et al., and is entitled "Variable Delay Line Phase-Locked Loop Circuit Synchronization System," the entire content of which is herein incorporated by reference.

The voltage-controlled delay line disclosed in Johnson, et. al. is capable of providing a fixed time delay as well, and thus can be used as the fixed delay line 130 to delay the output of the PLL 105 by a fixed time interval. As disclosed in Johnson, et al., the voltage-controlled delay line delays a clock signal by a fixed time interval when its control lines are coupled to $V_{cc}$ and $V_{ss}$. Those skilled in the art will appreciate that it is possible to delay a clock signal by a fixed time interval in other ways as well, such as using an alternating series of capacitors and inverters.

As illustrated in FIG. 2, the master loop 145 is typically of a smaller size than the slave loop 150. To compensate for the variation in the propagation distance between the master and the slave loop 145,150, the master loop 145 includes the fixed delay line 130, which delays the output signal of the PLL 105 by a fixed time interval, "t_fix_delay." Because the master loop 145 includes a fixed delay of "t_fix_delay," it follows that the minimum delay range of the variable delay line 115 of the slave loop 150 should be "t_fix_delay−t_max_skew" to "t_fix_delay+t_max_skew" to allow the slave loop 150 to be in phase with the SRC 20. Because the SRC 15 can lead or lag the MRC 20 when it reaches the device 100, the amount of delay produced by the variable delay line 115 varies by a time interval of "t_max_skew" in either direction.

The phase detector 110 in the slave loop 150 detects the phase skew between a slave loop clock signal 155 and the SRC 20. The phase detector 110 generates a control signal which can then be utilized to control the delay interval to be produced by the variable delay line 115. That is, when the slave loop clock signal 155 lags the SRC 20, the output of the phase detector 110 will cause the variable delay line 115 to reduce its delay. Conversely, when the slave loop clock signal 155 leads the SRC 20, the variable delay line 115 will increase the amount of delay based on the output of the phase detector 155.

This particular invention takes advantage of the fact that the MRC and SRC 15,20 are generated from the same reference clock 25, and, therefore, have the same frequency. Furthermore, because the MRC and SRC 15,20 are generated by a common reference clock 25, any phase shift in the common reference clock 25 propagates not only to the MRC 15 but also to the SRC 20. Thus, a single PLL 105 can handle the phase shifts caused by the common reference clock 25 for both the MRC 15 and the SRC 20.

The method and apparatus of the present invention can be utilized in a variety of configurations that use a common reference clock 25 to synchronize a plurality of I/O channels of an electrical device. For example, in a configuration having a microprocessor coupled to two cache memories or, alternatively, a cache memory coupled to two microprocessors, can employ the instant invention to synchronize the clock signals.

The present invention is not limited to synchronizing clock signals for only two I/O channels 40,50, as shown in FIG. 2. Rather, the present invention can be utilized for synchronizing clock signals for a plurality of I/O channels by utilizing additional slave loops 150 that include the variable delay line 115 and the phase detector 110.

Those skilled in the art will appreciate that a DLL (not shown) or any other phase aligning device (not shown) can be utilized in lieu of the PLL 105 in FIG. 2. As an example, it is possible to utilize a DLL to generate and synchronize a receiver (or a driver) clock signal (not shown) with a MRC 15 of the first I/O channel 40. The output signal from the DLL would then be input into the fixed delay line 130 of the master loop 145 as well as to the variable delay line 115 of the slave loop 150. Thus, it is possible to utilize a DLL instead of a PLL 105 to synchronize the receiver and reference clock signals. It should be apparent that the present invention is not limited to synchronizing receiver clock signals with reference clock signals and, instead, may be equally applicable to synchronizing driver clock signals with the reference clock signals as well. That is, the present invention is applicable not only when receiving signals, but also when transmitting signals.

As illustrated in FIG. 2, the present invention offers a method and apparatus for synchronizing clock signals in the device 100 having two I/O channels 40,50 using a single PLL 105, DLL (not shown), or any other phase aligning device (not shown). Utilizing only one PLL 105 or DLL, for example, in conjunction with the variable delay line 115 and the phase detector 110 not only results in less power consumption but also saves valuable circuit space that would otherwise be consumed by larger-sized PLLs/DLLs. Overall, the variable delay line 115 and the phase detector 110 consume very little power and space. Furthermore, additional can be saved by activating the phase detector 110 periodically.

Second Embodiment

Figure 3:
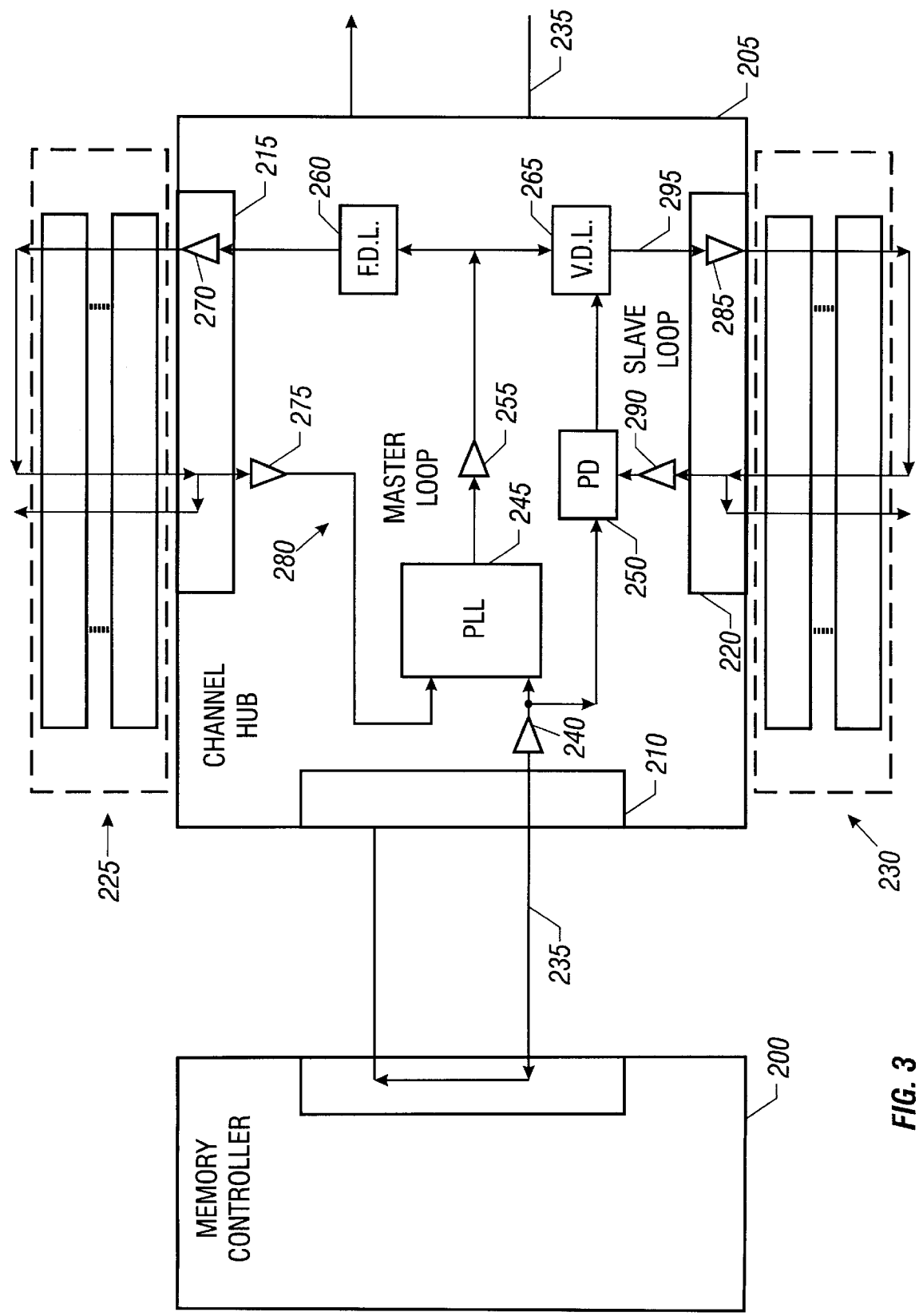
FIG. 3 is a block diagram of a second embodiment of the present invention.

FIG. 3 illustrates a second embodiment of the present invention, which includes a memory controller 200, a channel hub 205 having an expansion, a top, and a bottom channel 210, 215, 220, and a first and second DRAM bank 225, 230.

Generally, a single-channel device (such as the memory controller 200) utilizes a channel hub 205 to access a plurality of channels 215, 220. For example, FIG. 3 illustrates the single-channel memory controller 200 utilizing the channel hub 205 to access the first and second channels of DRAM banks 225, 230 through the top and bottom channels 215, 220, respectively. Without the channel hub 205, the single-channel memory controller 200 would be capable of accessing only a single channel of a DRAM bank. As shown in FIG. 3, the memory controller 200 interfaces with the expansion channel 210 of the channel hub 205 using an expansion channel clock signal 235.

The channel hub 205 comprises a first clock buffer 240 that is adapted to receive the expansion channel clock signal 235. The output of the first clock buffer 240 is coupled to a first input of a PLL 245 and to a first input of a phase detector 250. The output signal of the PLL 245 is coupled to an input of a second clock buffer 255, and the output of the second clock buffer 225 is coupled to an input of a fixed delay line 260, as well as to a first input of a variable delay line 265. The output signal from the fixed delay line 260 is coupled to a third clock buffer 270. The output of the third clock buffer 270 propagates through the top channel 215 and out to the first channel of the DRAM bank 225, and then back into an input of a fourth clock buffer 275. The output from the fourth clock buffer 275 is coupled to a second terminal of the PLL 245 to complete the feedback loop, hereinafter referred to as the "Master Loop" 280.

The output signal from the phase detector 250 is coupled to a second input terminal of the variable delay line 265. The output signal from the variable delay line 265 is coupled to an input of the fifth clock buffer 285. The output of the fifth clock buffer 285 propagates through the bottom channel 220, out to the second channel of the DRAM bank 230, and then back into an input of a sixth clock buffer 290. The sixth clock buffer 290 may be substantially the same as the fourth clock buffer 275 (i.e. they may have substantially identical flight times). The output from the sixth clock buffer 290 is coupled to a second terminal of the phase detector 250 to complete a loop, hereinafter referred to as the "Slave Loop" 295.

Although the top and the bottom channels 215, 220 are coupled to the respective channels of the DRAM banks 225, 230 in this embodiment, these channels 215, 220 may serve as an interface to other external devices (not shown) as well, depending on the configuration in which the present invention is implemented. Because these external devices are not always identical, and because the number of external devices coupled per channel may differ, the clock signals of the master loop 280 and the slave loop 295 propagating through these external devices may become skewed with respect to each other.

In the second embodiment of the present invention, one PLL 245 is utilized to phase align the expansion channel clock signal 235 with the clock signal of the master loop 280 and the clock signal of the slave loop 295. Because the expansion channel clock signal 235 is a common input to both the PLL 245 of the master loop 280 and the phase detector 250 of the slave loop 295, it is possible for the clock signals of the master and slave loops 280, 295 to be phase aligned with each other.

The fixed delay line 260 and the variable delay line 265 are utilized in a similar manner as described in the first embodiment. The variable delay line 265 should be adaptable to account for the maximum skew ("t_max_skew") between the clock signal of the master loop 280 and the slave loop 295. That is, the range of the variable delay line 265 should be "t_fix_delay–t_max_skew" to "t_fix_delay+t_max_skew," where the "t_fix_delay" is the delay of the fixed delay line 260. The fixed and variable delay lines 260, 265 utilized in the first embodiment can also be employed in the second embodiment. Other known methods of delaying clock signals can also be utilized to delay the clock signals by the desired time interval in the master and slave loops 280, 295.

It should be apparent to those skilled in the art that a DLL (not shown) or any other known phase aligning device (not shown) can implemented in the second embodiment of the present invention in lieu of the PLL 245 in FIG. 3. Like the PLL 245, a single DLL (or other known phase aligning devices) could be utilized to synchronize the expansion channel clock signal with the clock signals of the master and slave loops 280, 295.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

We claim:

1. A method for synchronizing clock signals, comprising:
   receiving a first reference clock signal;
   receiving a second reference clock signal;
   generating a phase-locked or delay-locked output of the first reference clock signal;
   delaying the output by a first delay interval to generate a first clock output signal, which is also coupled back as feedback for aligning the output to the first reference clock signal
   delaying the output by a second delay interval to generate a second clock output signal;
   detecting a phase difference between the second clock output signal and the second reference clock signal to determine skew;
   generating a correction signal to vary the second delay interval to correct the skew to synchronize the first and second clock output signals.

2. The method of claim 1, wherein the receiving of the first and second reference clock signals receives the same reference clock signal as the first and second reference clock signals.

3. The method of claim 1, wherein the second delay interval has a range of delay calculated as the first interval minus the skew to the first interval plus the skew.

4. The method of claim 1 further comprising the generation of a plurality of second clock output signals, each having its skew adjusted separately.

5. The method of claim 1, wherein the delaying the output by the first delay interval includes delaying the output so that the first delay interval is a fixed interval.

6. The method of claim 5, wherein the delaying the output by the second delay interval includes delaying the output so that the second delay interval is a variable interval.

7. The method of claim 6, wherein the generating the correction signal adjusts the second delay interval, which is variable.

8. The method of claim 7, wherein the receiving of the first and second reference clock signals receives the same reference clock signal as the first and second reference clock signals.

9. An apparatus for synchronizing clock signals comprising:
   a phase aligning circuit coupled to receive a reference clock signal and generate an output signal, which is phase aligned with the reference clock signal;
   a fixed delay circuit coupled to the phase aligning circuit to receive its output signal and for generating a first clock signal, which is delayed from the output signal by a first delay interval;
   the first clock signal coupled to a first destination and also coupled as feedback to the phase aligning circuit;
   a slave circuit coupled to receive the output signal of the phase aligning circuit and for generating a second clock signal to a second destination, wherein the second clock signal is delayed from the output signal by a second delay interval;
   the slave circuit also coupled to receive the reference clock signal to detect a phase difference between the reference clock signal and the second clock signal and adjusting the second delay to synchronize the first and second clock signals.

10. The apparatus of claim 9, wherein the slave circuit is actually comprised of a plurality of such slave circuits.

11. The apparatus of claim 10, wherein the plurality of slave circuits are connected in parallel with respect to each other.

12. The apparatus of claim 10, wherein the plurality of slave circuits are connected in series with respect to each other.

13. The apparatus of claim 9, wherein the slave circuit further comprises:
    a variable delay circuit for introducing the second delay interval which is adjustable; and
    a phase detector coupled to detect the phase difference and correspondingly adjust the variable delay circuit to synchronize the first and second clock signals.

14. The apparatus of claim 13, wherein the phase aligning circuit includes a phase-lock loop.

15. The apparatus of claim 13, wherein the phase aligning circuit includes a delay-lock loop.

16. The apparatus of claim 13, wherein the fixed delay circuit includes a fixed delay line.

17. The apparatus of claim 13, wherein the first delay interval is to compensate for a propagation delay of the output signal to the slave circuit and the second delay interval is to adjust for a skew between the first and second clock signals.

18. The apparatus of claim 13, wherein the variable delay circuit includes a variable delay line.

19. The apparatus of claim 18, wherein the variable delay line is adjustable over a range of skew values encountered between the first and second clock signals.

20. An apparatus for synchronizing clock signals comprising:
    a phase aligning circuit coupled to receive a first reference clock signal and generate a reference output signal, which is phase aligned with the first reference clock signal;
    a fixed delay circuit coupled to the phase aligning circuit to receive its reference output signal and for generating a first clock output signal, which is delayed from the reference output signal by a first delay interval;
    the first clock output signal also coupled as feedback to the phase aligning circuit;
    a slave circuit coupled to receive the reference output signal of the phase aligning circuit and for generating a second clock output signal, wherein the second clock output signal is delayed from the reference output signal by a second delay interval;
    the slave circuit also coupled to receive a second reference clock signal to detect a phase difference between the second reference clock signal and the second clock output signal and adjusting the second delay interval to synchronize the first and second clock output signals.

21. The apparatus of claim 20, wherein the slave circuit further comprises:
    a variable delay circuit for introducing the second delay interval which is adjustable; and
    a phase detector coupled to detect the phase difference between the second reference clock signal and the second clock output signal and correspondingly adjust the variable delay circuit to synchronize the first and second clock output signals.

22. The apparatus of claim 20, wherein the phase aligning circuit includes either a delay-lock loop or a phase-lock loop.

23. An apparatus for synchronizing clock signals comprising:

means for aligning the phases of a first clock output signal with a first reference clock signal;

means for receiving an output from the means for aligning and delaying the first reference clock signal by a first delay interval to generate the first clock output signal;

means for variably delaying the output from the means for aligning by a second delay interval to generate a second clock output signal; and means for determining a phase difference between the second clock output signal and a second reference clock signal to vary the second delay interval to synchronize the first and second clock output signals.

24. The apparatus of claim 23 wherein the first and second reference clock signals are the same signal.

25. The apparatus of claim 24, wherein the means for aligning includes a phase-lock loop or a delay-lock loop.

26. The apparatus of claim 25, wherein the means for delaying includes a fixed delay line.

27. The apparatus of claim 26, wherein the means for determining includes a phase detector.

* * * * *

UNITED STATES PATENT AND TRADEMARK OFFICE
CERTIFICATE OF CORRECTION

PATENT NO. : 5,964,880
DATED : October 12, 1999
INVENTOR(S) : Liu et al.

It is certified that error appears in the above-identified patent and that said Letters Patent is hereby corrected as shown below:

<u>Column 1,</u>
Line 11, delete "Modem", insert -- Modern --.

Signed and Sealed this

Eighth Day of April, 2003

JAMES E. ROGAN
*Director of the United States Patent and Trademark Office*